United States Patent
Kudla et al.

(10) Patent No.: US 11,081,512 B2
(45) Date of Patent: Aug. 3, 2021

(54) OPTICAL CROSSTALK MITIGATION FOR A DETECTOR ARRAY IN AN OPTICAL RECEIVER

(71) Applicant: Infineon Technologies AG, Neubiberg (DE)

(72) Inventors: Wojciech Kudla, Wageningen (NL); Boris Kirillov, Graz (AT); Marijn Van Os, Eindhoven (NL); Harm Wichers, RB Malden (NL)

(73) Assignee: Infineon Technologies AG

( * ) Notice: Subject to any disclaimer, the term of this patent is extended or adjusted under 35 U.S.C. 154(b) by 0 days.

(21) Appl. No.: 16/590,702

(22) Filed: Oct. 2, 2019

(65) Prior Publication Data

US 2021/0104566 A1 Apr. 8, 2021

(51) Int. Cl.
*H01L 27/146* (2006.01)

(52) U.S. Cl.
CPC .. *H01L 27/14623* (2013.01); *H01L 27/14636* (2013.01); *H01L 27/14643* (2013.01); *H01L 27/14685* (2013.01)

(58) Field of Classification Search
CPC ............ H01L 27/14623; H01L 27/14636
See application file for complete search history.

(56) References Cited

U.S. PATENT DOCUMENTS

2018/0331136 A1\* 11/2018 Crocherie ......... H01L 27/14623

\* cited by examiner

*Primary Examiner* — Farun Lu
(74) *Attorney, Agent, or Firm* — Design IP

(57) ABSTRACT

A method of manufacturing a photodetector device is provided. The method includes providing a photodetector array comprising an array of photodetectors and a plurality of metal structures arranged between photodetectors of the array of photodetectors, where the plurality of metal structures are arranged in a first pattern; applying an antireflective coating to a surface of a transparent substrate, the antireflective coating being patterned according to a second pattern that matches the first pattern; aligning the transparent substrate over the photodetector array such that the first pattern is aligned with the second pattern; and coupling the transparent substrate to the photodetector array such that the antireflective coating covers the plurality of metal structures.

19 Claims, 3 Drawing Sheets

OPTICAL CROSSTALK MITIGATION FOR A DETECTOR ARRAY IN AN OPTICAL RECEIVER

FIELD

The present disclosure relates generally to a detector array for an optical receiver and to methods for manufacturing the same.

BACKGROUND

Optical receivers are used in cameras and image sensors, such as Light Detection and Ranging (LIDAR) receivers. Optical receivers may use a detector array made up of an array of photodetectors, such as photodiodes, for receiving and measuring light that is reflected from objects in an environment. For example, LIDAR is a remote sensing method that uses light in the form of a pulsed laser to measure ranges (variable distances) to one or more objects in a field of view. In particular, light is transmitted towards one or more objects. Single photodetectors or arrays of photodetectors receive reflections from objects illuminated by the light, and the time it takes for the reflections to arrive at various sensors in the photodetector array is determined. This is also referred to as measuring time-of-flight (ToF). LIDAR systems form depth measurements and make distance measurements by mapping the distance to objects based on the time-of-flight computations. Thus, the time-of-flight computations can create distance and depth maps, which may be used to generate images. Other types of camera systems may also use photodetectors for generating images based on detected light.

Optical receivers typically include a receiver optics and a detector array. The receiver optics initially receives the light and directs the light towards the detector array. The detector array typically includes multiple sensitive parts in the way of the photodetectors and non-sensitive part in the way of metal structures formed around each sensitive part. The metal structures may include metal lines that are used to read out electrical signals generated by the photodetectors. While the sensitive parts absorb light, the metal structures have a reflectivity that may exceed 70%. As a result, some light received at the detector array may be reflected back by the metal structures towards the receiver optics, which may in turn reflect the light back towards a different region of the detector array by surface residual reflection. This "bouncing" light between the detector array and the receiver optics causes optical crosstalk between neighboring photodetectors and may negatively impact the accuracy of the measured light and the resultant image.

Therefore, an improved device having a detector array that mitigates optical crosstalk may be desirable.

SUMMARY

Embodiments provide a method of manufacturing a photodetector device. The method includes providing a photodetector array comprising an array of photodetectors and a plurality of metal structures arranged between photodetectors of the array of photodetectors, wherein the plurality of metal structures are arranged in a first pattern; applying an antireflective coating to a surface of a transparent substrate, the antireflective coating being patterned according to a second pattern that matches the first pattern; aligning the transparent substrate over the photodetector array such that the first pattern is aligned with the second pattern; and coupling the transparent substrate to the photodetector array such that the antireflective coating covers the plurality of metal structures.

Embodiments provide a photodetector device that includes a photodetector array including an array of photodetectors and a plurality of metal structures arranged between photodetectors of the array of photodetectors, wherein the plurality of metal structures are arranged in a first pattern; and a transparent substrate including a plurality of trenches being patterned according to a second pattern that matches the first pattern and at least partially filled with an antireflective material such that the antireflective material takes on the second pattern. The transparent substrate and the photodetector array are coupled together such that the first pattern is aligned with the second pattern and the antireflective material covers the plurality of metal structures.

Embodiments provide a method of manufacturing a photodetector device. The method includes providing a photodetector array including an array of photodetectors and a plurality of metal structures arranged between photodetectors of the array of photodetectors, wherein the plurality of metal structures are arranged in a first pattern; forming a plurality of trenches in a transparent substrate, the plurality of trenches being patterned according to a second pattern that matches the first pattern; at least partially filing the plurality of trenches with an antireflective material such that the antireflective material takes on the second pattern; aligning the transparent substrate over the photodetector array such that the first pattern is aligned with the second pattern; and coupling the transparent substrate to the photodetector array such that the antireflective material covers the plurality of metal structures.

Embodiments provide a photodetector device that includes a photodetector array including an array of photodetectors and a plurality of metal structures arranged between photodetectors of the array of photodetectors, wherein the plurality of metal structures are arranged in a first pattern; and a transparent substrate including a plurality of diffusion structures being patterned according to a second pattern that matches the first pattern, wherein each of the plurality of diffusion structures is configured to redirect light that is incident thereon. The transparent substrate and the photodetector array are coupled together such that the first pattern is aligned with the second pattern and the plurality of diffusion structures covers the plurality of metal structures.

Embodiments provide a method of manufacturing a photodetector device. The method includes providing a photodetector array including an array of photodetectors and a plurality of metal structures arranged between photodetectors of the array of photodetectors, wherein the plurality of metal structures are arranged in a first pattern; forming a plurality of diffusion structures in a transparent substrate, the plurality of diffusion structures being patterned according to a second pattern that matches the first pattern, wherein each of the plurality of diffusion structures is configured to redirect light that is incident thereon; aligning the transparent substrate over the photodetector array such that the first pattern is aligned with the second pattern; and coupling the transparent substrate to the photodetector array such that the plurality of diffusion structures covers the plurality of metal structures.

BRIEF DESCRIPTION OF THE DRAWINGS

Embodiments are described herein making reference to the appended drawings.

DETAILED DESCRIPTION

Figure 1A:
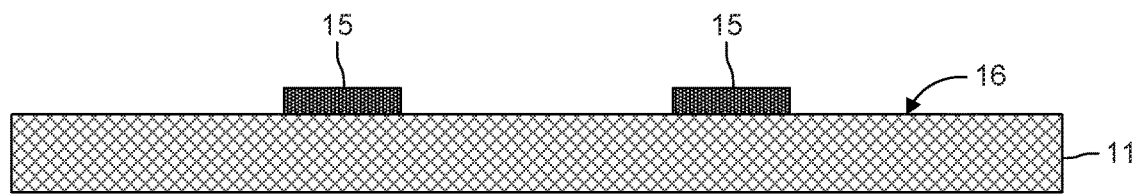
FIGS. 1A-1C illustrate a process of manufacturing a photodetector device according to one or more embodiments.

In the following, various embodiments will be described in detail referring to the attached drawings, where like reference numerals refer to like elements throughout. It should be noted that these embodiments serve illustrative purposes only and are not to be construed as limiting. For example, while embodiments may be described as comprising a plurality of features or elements, this is not to be construed as indicating that all these features or elements are needed for implementing embodiments. Instead, in other embodiments, some of the features or elements may be omitted, or may be replaced by alternative features or elements. Additionally, further features or elements in addition to the ones explicitly shown and described may be provided, for example conventional components of sensor devices.

Features from different embodiments may be combined to form further embodiments, unless specifically noted otherwise. Variations or modifications described with respect to one of the embodiments may also be applicable to other embodiments. In some instances, well-known structures and devices are shown in block diagram form rather than in detail in order to avoid obscuring the embodiments.

In the following detailed description reference is made to the accompanying drawings, which form a part hereof and in which are illustrated by way of illustration example embodiments. In this regard, directional terminology such as "top", "bottom", "front", "back", "leading", "trailing" etc. is used with reference to the orientation of the Figures being described. Similarly, the terms "above" and "below" as used in this specification may describe a relative location of a structural feature to another. The term "horizontal" as used in this specification intends to describe an orientation substantially parallel to a first or main surface of a substrate or body. The term "vertical" as used in this specification intends to describe an orientation which is substantially arranged perpendicular to the first or main surface, i.e. parallel to the normal direction of the first surface of the substrate or body.

Since components of the embodiments can be positioned in a number of different orientations, the directional terminology is used for purposes of illustration and is in no way limiting. It is to be understood that other embodiments may be utilized and structural or logical changes may be made without departing from the scope defined by the claims.

Embodiments relate to optical sensors and optical sensor systems and to obtaining information about optical sensors and optical sensor systems. A sensor may refer to a component which converts a physical quantity to be measured to an electric signal, for example a current signal or a voltage signal. The physical quantity may, for example, comprise electromagnetic radiation, such as visible light, infrared (IR) radiation, or other type of illumination signal, a current, or a voltage, but is not limited thereto. For example, an image sensor may be a silicon chip inside a camera that converts photons of light coming from a lens into voltages. The larger the active area of the sensor, the more light that can be collected to create an image.

A sensor device as used herein may refer to a device which comprises a sensor and further components, for example biasing circuitry, an analog-to-digital converter or a filter. A sensor device may be integrated on a single chip, although in other embodiments a plurality of chips or also components external to a chip may be used for implementing a sensor device.

According to the embodiments, a photodetector array is used to measure the reflected light. The photodetector array may be a one-dimensional (1D) array that consists of multiple rows of photodetectors (pixels) arranged in a single column or a two-dimensional (2D) array that consists of multiple rows and columns of photodetectors arranged in a grid-like arrangement. Each photodetector is configured to generate an electrical signal (e.g., an electrical pulse) in response to receiving light. Each photodetector may be read out as measurement signal in the form of raw analog data.

The photodetector array can be any of a number of photodetector types; including avalanche photodiodes (APD), photocells, and/or other photodiode devices. Imaging sensors such as charge-coupled devices (CCDs) can be the photodetectors. As provided herein, "photodiodes", "photodetectors", and "pixels" are used interchangeably and represent the active area or the sensitive area of the photodetector array capable of detecting photons. In the examples provided herein, the photodetector array is a 2D array of APD pixels, but this is merely intended to serve as one example of a photodetector array and should not be construed as limiting.

Metal areas described herein are a non-sensitive or non-active area that is arranged around a periphery of each pixel. The metal areas may include metal structures used to produce an electric field used to tailor one or more properties of the photodetector array. Additionally, the metal areas may include metal lines, metal contacts, etc. that may be used for electrical pathways to carry electrical signals. For example, the metal areas may be used to activate a pixel and/or read out electrical signals generated by a pixel. The metal areas may be considered a highly reflective area with respect to received light. For example, the metal areas may have a reflectivity that meets or exceeds 70%.

Figure 1B:
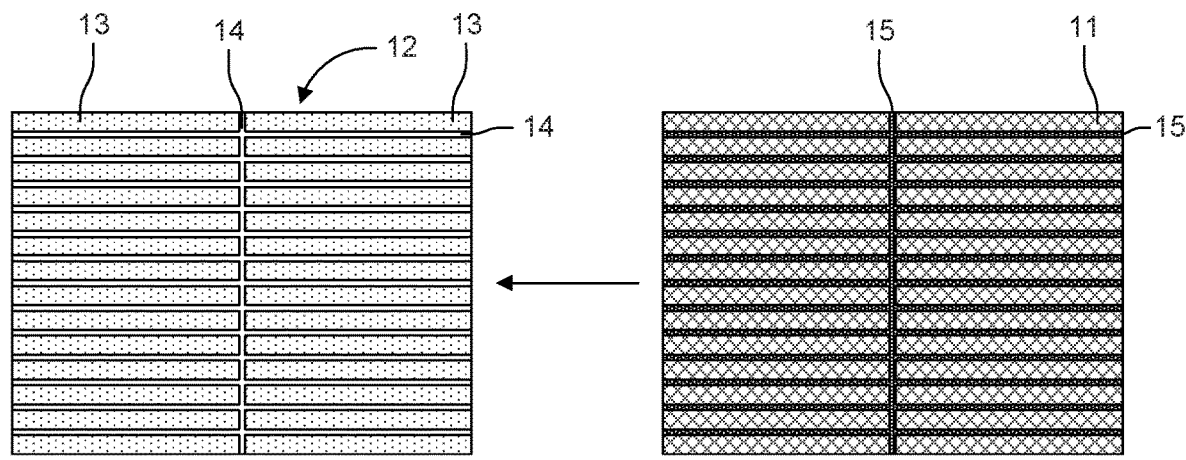
Figure 1C:
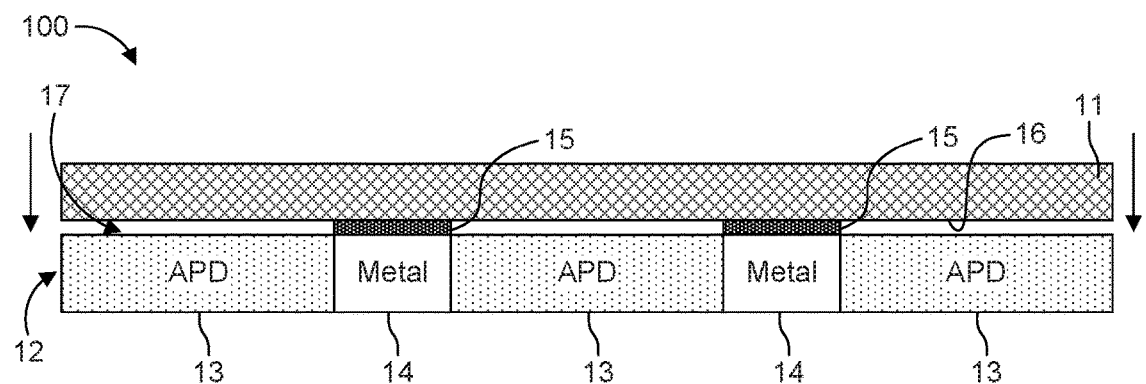

FIGS. 1A-1C illustrate a process of manufacturing a photodetector device 100 according to one or more embodiments. The photodetector device 100 includes a transparent substrate 11 (e.g., a transparent plate) disposed over a photodetector array 12.

The transparent substrate 11 is made of a transparent material, such as glass, that permits the transmission of light therethrough.

The photodetector array 12 includes an array of photodetectors comprising a plurality of photodetectors 13. The photodetector array 12 further includes a plurality of metal structures 14 arranged between the photodetectors 13 of the photodetector array 12. The plurality of metal structures 14 are arranged in a first (metal) pattern. For example, the plurality of metal structures 14 may be arranged in a grid pattern. Furthermore, the plurality of metal structures 14 may be coupled together to form one-piece integral construction. That is, they may form a single member.

The photodetector device 100 further includes an antireflective coating 15 (e.g., a black coating) applied to a front surface 16 of the transparent substrate 11 in a second (antireflective coating) pattern that coincides and is aligned with the first pattern of the plurality of metal structures 14. In other words, the second pattern matches the first pattern. The transparent substrate 11 is disposed over a surface of the photodetector array 12 such that the front surface 16 faces towards the sensitive regions of the photodetector array 12. The antireflective coating 15 is aligned with the plurality of metal structures 14 such that the second pattern is aligned with the first pattern. As a result, the antireflective coating 15 is disposed onto the plurality of metal structures 14 as serves as a shadowing mask such that the antireflective coating 15 absorbs incoming light and prevents the incoming light from reaching the plurality of metal structures 14. As a result, optical crosstalk that could be caused by the plurality of metal structures 14 is prevented.

The antireflective coating 15 may be any material that has an antireflective property sufficient to absorb light to reduce or eliminate optical crosstalk may be used. For example, the material may be at least 80% antireflective/absorptive (i.e., less than 20% reflective), and more preferably, at least 90% antireflective/absorptive (i.e., less than 10% reflective), and even more preferably, at least 95% antireflective/absorptive (i.e., less than 5% reflective). Reflectivity is the amount or percentage of light or radiation that is reflected by a material and anti-reflectivity is the amount or percentage of light or radiation that is absorbed by a material. Thus, a highly antireflective material is defined as a highly absorptive material, and varying degrees of antireflectivity correspond to varying degrees of absorptivity. To be clear, antireflectivity does not correspond to transparency.

FIG. 1A illustrates a step of manufacturing the photodetector device 100 according to one or more embodiments. In particular, FIG. 1A illustrates applying the antireflective coating 15 to the front surface 16 of the transparent substrate 11 according to the second pattern of the antireflective coating.

FIG. 1B illustrates another step of manufacturing the photodetector device 100 according to one or more embodiments. In particular, FIG. 1B illustrates a top view of aligning the transparent plate 11, having the antireflective coating 15 applied thereto, with the photodetector array 12 such that the second pattern of the antireflective coating is aligned with the first pattern of the plurality of metal structures 14.

FIG. 1C illustrates another step of manufacturing the photodetector device 100 according to one or more embodiments. In particular, FIG. 1C illustrates, once the second pattern of the antireflective coating is aligned with the first pattern of the plurality of metal structures 14, disposing the transparent plate 11 with the antireflective coating 15 onto the photodetector array 12 such that the antireflective coating 15 covers the plurality of metal structures 14. The transparent plate 11 is coupled to the photodetector array 12.

The antireflective coating 15 may be disposed onto the plurality of metal structures 14 such that the antireflective coating 5 is in direct contact with the plurality of metal structures 14. As such, there may be a small gap 17 between the transparent plate 11 and the photodetector array 12. This gap 17 may be filled with an adhesive to bind the transparent plate 11 and the photodetector array 12 together. FIG. 1C illustrates a cross-sectional view of the final assembled photodetector device 100.

Figure 2:
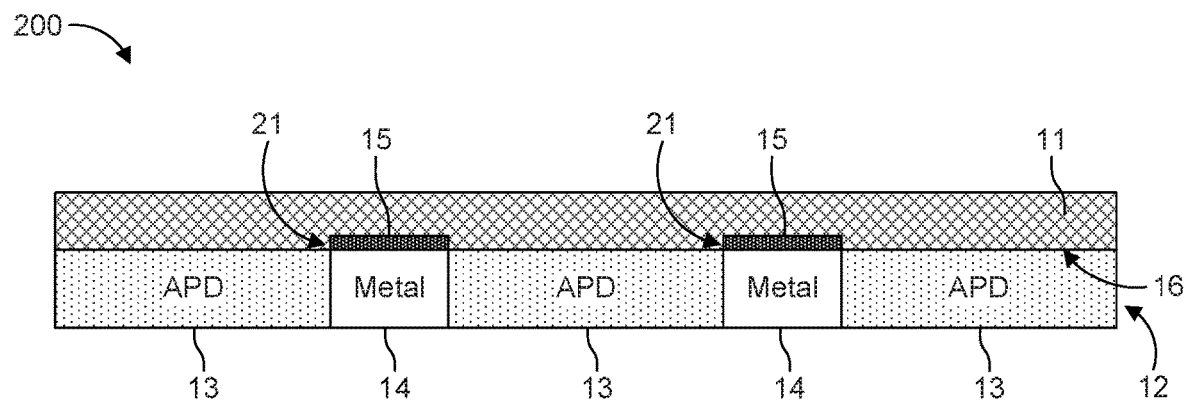
FIG. 2 illustrates a cross-sectional view of an assembled photodetector device according to one or more embodiments.

FIG. 2 illustrates a cross-sectional view of an assembled photodetector device 200 according to one or more embodiments. In particular, the photodetector device 200 is similar to the photodetector device 100 illustrated in FIG. 1C except the transparent plate 11 includes patterned trenches 21. In particular, prior to applying the antireflective coating 15, the transparent plate 11 is etched with trenches 21 according to the second pattern to match the first pattern of the plurality of metal structures 14. Thus, the trenches 21 are formed in the transparent substrate 11 at the front surface 16 and extend vertically into the transparent substrate 11 from the front surface 16. The trenches 21 may be coupled together to form a unitary trench according to the second pattern.

The trenches 21 are then filled with the antireflective coating 15 such that the antireflective coating 15 is embedded within the transparent substrate 11. As a result of the patterned trenches 21, the antireflective coating 15 takes on the pattern of the trenches, and thus the pattern of the plurality of metal structures 14.

The outer or exposed surface of the antireflective coating 15 is planar with the front surface 16 of the transparent substrate 11.

The pattern of the trenches/antireflective coating is then aligned with pattern of the plurality of metal structures 14 in a similar manner illustrated in FIG. 1B.

Once the patterns are aligned, the transparent plate 11 with the antireflective coating 15 is disposed onto the photodetector array 12 such that the antireflective coating 15 covers the plurality of metal structures 14. The antireflective coating 15 may be disposed onto the plurality of metal structures 14 such that the antireflective coating 15 is in direct contact with the plurality of metal structures 14. In addition, the transparent plate 11 may be arranged on the front surface 16 of the photodetector array 12 to be in direct contact with the photodetectors 13, with no gap therebetween, due to the outer or exposed surface of the antireflective coating 15 being planar with the front surface 16 of the transparent substrate 11. Alternatively, an adhesive may be applied between the transparent plate 11 and the photodetectors 13 to bind the transparent plate 11 and the photodetector array 12 together.

Figure 3:
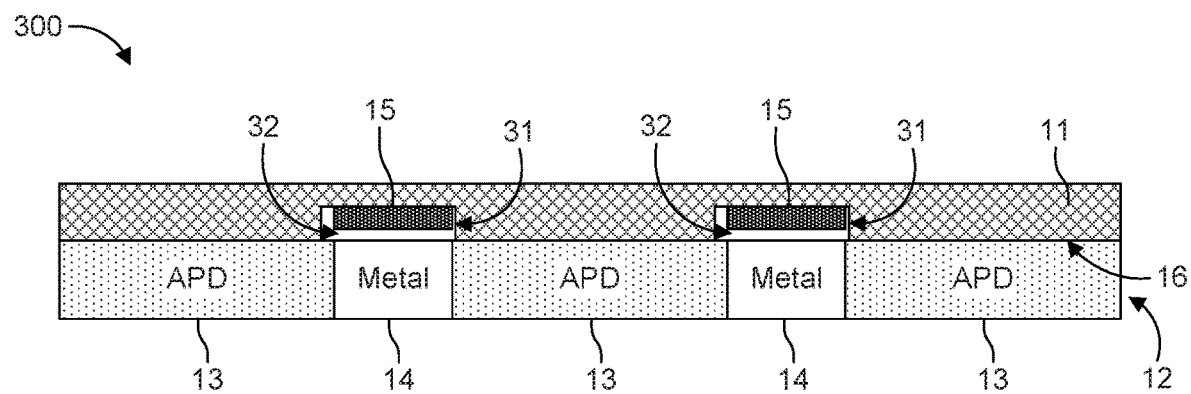
FIG. 3 illustrates a cross-sectional view of an assembled photodetector device according to one or more embodiments.

FIG. 3 illustrates a cross-sectional view of an assembled photodetector device 300 according to one or more embodiments. In particular, the photodetector device 300 is similar to the photodetector device 200 illustrated in FIG. 2 except the transparent plate 11 includes patterned deep trenches 31. In particular, prior to applying the antireflective coating 15, the transparent plate 11 is etched with deep trenches 31 according to the second pattern to match the first pattern of the plurality of metal structures 14. Thus, the deep trenches 21 are formed in the transparent substrate 11 at the front surface 16 and extend vertically into the transparent substrate 11 from the front surface 16. However, in contrast to the trenches 21 shown in FIG. 2, the deep trenches 31 may extend further into the transparent substrate 11 to allow for an air gap 32 between the antireflective coating 15 and the metal structures 14.

Thus, deep trenches 31 are only partially filled with the antireflective coating 15 after being formed such that the antireflective coating 15 is embedded entirely within the transparent substrate 11. As a result of the patterned trenches 31, the antireflective coating 15 takes on the pattern of the trenches, and thus the pattern of the plurality of metal structures 14. However, as a result of only partially filing the trenches 31, the antireflective coating 15 is not planar with the front surface 16. Instead, the vertical dimension (e.g., thickness) of the antireflective coating 15 is less than the vertical dimension (e.g., depth) of the trenches 31.

Once the deep trenches 31 are partially filled with antireflective coating 15, the pattern of the trenches/antireflective coating is then aligned with pattern of the plurality of metal structures 14 in a similar manner illustrated in FIG. 1B.

Once the patterns are aligned, the transparent plate 11 with the antireflective coating 15 is disposed onto the photodetector array 12 such that the antireflective coating 15 covers the plurality of metal structures 14. However, since the thickness of the antireflective coating 15 is less than the depth of the trenches 31, an air gap 32 is formed between the antireflective coating 15 and the metal structures 14. The air gap 32 may be desirable to avoid the antireflective coating 15 coming in contacts with the metal structures 14. In particular, the antireflective coating 15 may have a non-zero conductivity which may alter the electric field generated by the metal structures 14 and thereby change the electrical parameters of the photodetectors 13 in an unintended or undesirable way. Thus, by preventing contact, the electrical parameters of the photodetectors 13 may be maintained as intended.

In addition, the transparent plate 11 may be arranged on the front surface 16 of the photodetector array 12 to be in direct contact with the photodetectors 13, with no gap therebetween, due to the antireflective coating 15 being fully embedded within the transparent substrate 11. Alternatively, an adhesive may be applied between the transparent plate 11 and the photodetectors 13 to bind the transparent plate 11 and the photodetector array 12 together.

Figure 4A:
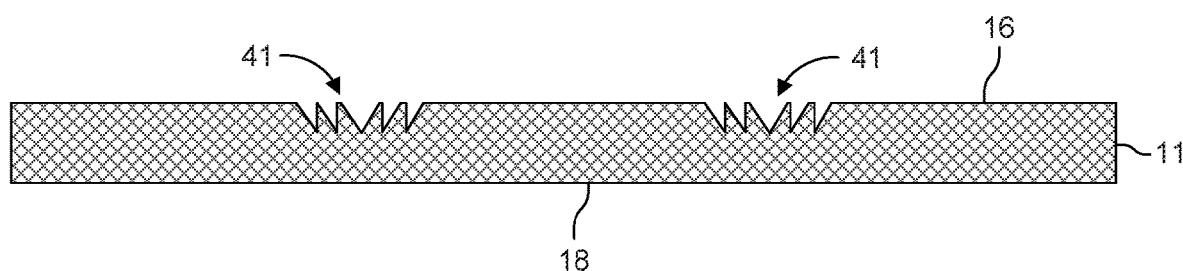
FIGS. 4A-4C illustrate a process of manufacturing a photodetector device according to one or more embodiments.
Figure 4B:
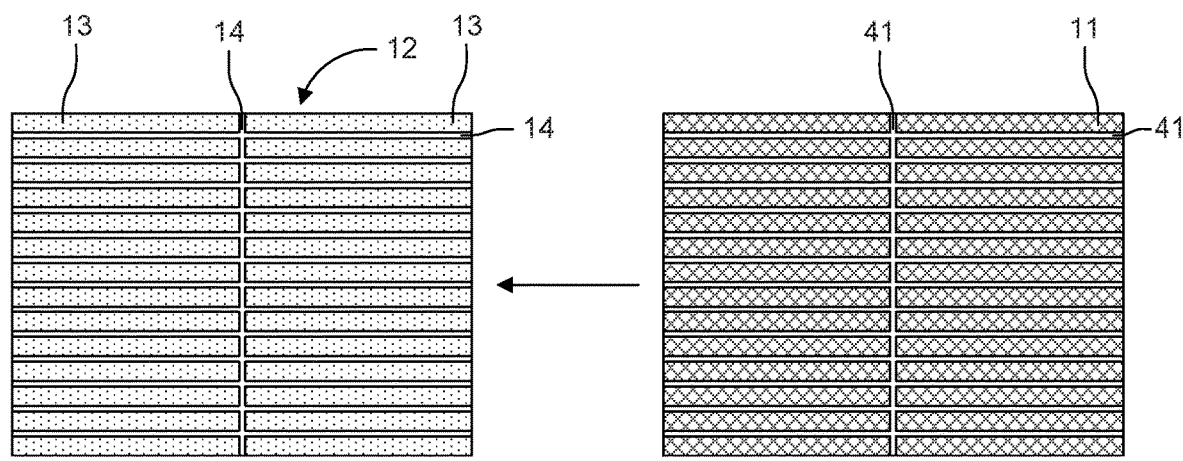
Figure 4C:
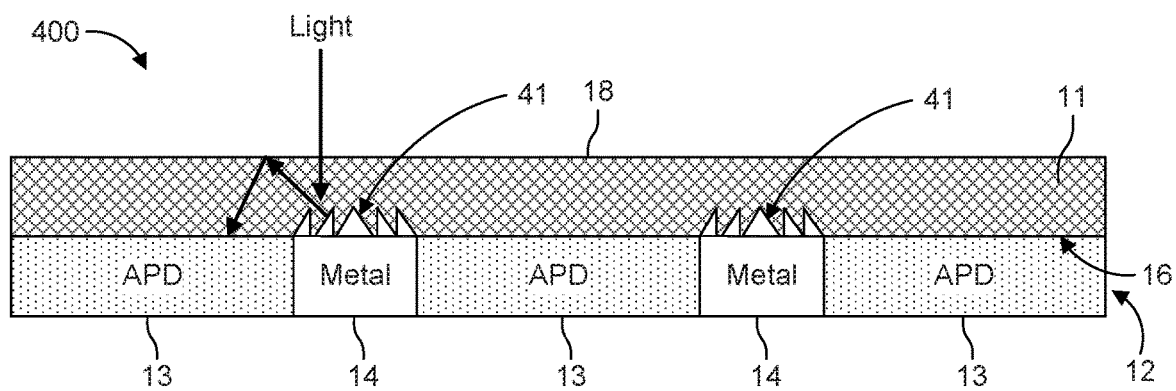

FIGS. 4A-4C illustrate a process of manufacturing a photodetector device 400 according to one or more embodiments. Similar to the photodetector device 100, the photodetector device 400 includes a transparent substrate 11 (e.g., a transparent plate) disposed over a photodetector array 12.

However, instead of using an antireflective coating, the photodetector device 400 uses microsteering structures 41, which may be referred to as diffusion structures 41, formed in the transparent substrate 11 by, for example, etching. The diffusion structures 41 may be formed in a pattern (steering structure pattern) that coincides and is aligned with the first pattern of the plurality of metal structures 14. In other words, the steering structure pattern is a second pattern that matches the first pattern. The diffusion structures 41 are configured to steer (i.e., redirect) light that is incident thereon away from an adjacent metal structure 14 and steer the light towards a photodetector 13 that is arranged immediately adjacent to the respective diffusion structure 41. For example, as illustrated in FIG. 4C, light that is incident on a diffusion structure 41 is reflected back at surface 18 of the transparent substrate 11, which reflects the light back at the adjacent photodetector 13 by internal reflection.

The transparent substrate 11 is disposed over a surface of the photodetector array 12 such that the front surface 16 faces towards the sensitive regions of the photodetector array 12. The diffusion structures 41 are aligned with the plurality of metal structures 14 such that the second pattern is aligned with the first pattern. As a result, the diffusion structures 41 are disposed over the plurality of metal structures 14 as serves as a steering structure mask such that the diffusion structures 41 steer incoming light to adjacent photodetectors 13 and prevent the incoming light from reaching the metal structures 14. As a result, optical crosstalk that could be caused by the metal structures 14 is prevented.

FIG. 4A illustrates a step of manufacturing the photodetector device 400 according to one or more embodiments. In particular, FIG. 4A illustrates forming the diffusion structures 41 at the front surface 16 of the transparent substrate 11 according to the second pattern. Thus, the diffusion structures 41 extend from the front surface 16 into the transparent substrate 11. Etching may be used to form the diffusion structures 41.

FIG. 4B illustrates another step of manufacturing the photodetector device 400 according to one or more embodiments. In particular, FIG. 4B illustrates a top view of aligning the transparent plate 11, having the diffusion structures 41 formed, with the photodetector array 12 such that the second pattern of the diffusion structures 41 is aligned with the first pattern of the metal structures 14.

FIG. 4C illustrates another step of manufacturing the photodetector device 400 according to one or more embodiments. FIG. 4C illustrates a cross-sectional view of the final assembled photodetector device 400. In particular, FIG. 4C illustrates, once the second pattern of the diffusion structures 41 is aligned with the first pattern of the plurality of metal structures 14, disposing the transparent plate 11 with the diffusion structures 41 onto the photodetector array 12 such that the diffusion structures 41 cover the metal structures 14.

In addition, the transparent plate 11 may be arranged on the front surface 16 of the photodetector array 12 to be in direct contact with the photodetectors 13, with no gap therebetween. Alternatively, an adhesive may be applied between the transparent plate 11 and the photodetectors 13 to bind the transparent plate 11 and the photodetector array 12 together.

Figure 5:
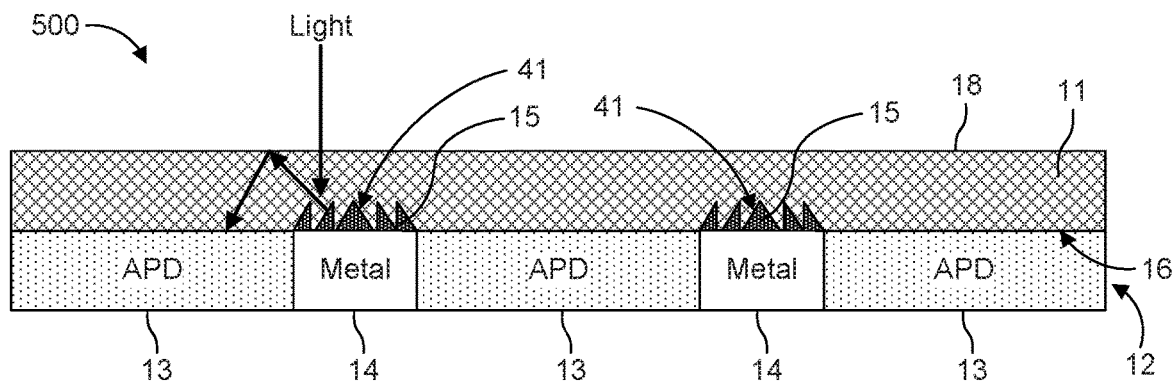
FIG. 5 illustrates a cross-sectional view of an assembled photodetector device according to one or more embodiments.

FIG. 5 illustrates a cross-sectional view of an assembled photodetector device 500 according to one or more embodiments. In particular, the photodetector device 500 is similar to the photodetector device 400 illustrated in FIG. 4C except the trenches (diffusion trenches) of the diffusion structures 41 are filled with antireflective coating 15, which may be performed in between steps illustrated by FIGS. 4A and 4B.

As a result, the trenches of the diffusion structures 41 being filled with the antireflective coating 15, the antireflective coating 15 is embedded within the transparent substrate 11. As a result, antireflective coating 15 takes on the pattern of the diffusion structures 41, and thus the pattern of the plurality of metal structures 14.

The outer or exposed surface of the antireflective coating 15 is planar with the front surface 16 of the transparent substrate 11.

The pattern of the diffusion structures/antireflective coating is then aligned with pattern of the metal structures 14 in a similar manner illustrated in FIG. 4B.

Once the patterns are aligned, the transparent plate 11 with the antireflective coating 15 and diffusion structures 41 is disposed onto the photodetector array 12 such that the antireflective coating 15 and the diffusion structures 41 cover the metal structures 14.

The antireflective coating 15 may be disposed onto the metal structures 14 such that the antireflective coating 15 is in direct contact with the metal structures 14. In addition, the transparent plate 11 may be arranged on the front surface 16 of the photodetector array 12 to be in direct contact with the photodetectors 13, with no gap therebetween, due to the outer or exposed surface of the antireflective coating 15 being planar with the front surface 16 of the transparent substrate 11. Alternatively, an adhesive may be applied between the transparent plate 11 and the photodetectors 13 to bind the transparent plate 11 and the photodetector array 12 together.

The following additional embodiments are provided:

1. A method of manufacturing a photodetector device, the method comprising: providing a photodetector array comprising an array of photodetectors and a plurality of metal structures arranged between photodetectors of the array of photodetectors, wherein the plurality of metal structures are arranged in a first pattern; applying an antireflective coating to a surface of a transparent substrate, the antireflective coating being patterned according to a second pattern that matches the first pattern; aligning the transparent substrate over the photodetector array such that the first pattern is aligned with the second pattern; and coupling the transparent substrate to the photodetector array such that the antireflective coating covers the plurality of metal structures.

2. The method of embodiment 1, wherein coupling the transparent substrate to the photodetector array includes arranging the antireflective coating onto the plurality of metal structures such that the antireflective coating is in contact with the plurality of metal structures.

3. The method of embodiment 1, wherein the antireflective coating is a black coating.

4. The method of embodiment 1, wherein the first pattern and the second pattern have a grid pattern.

5. The method of embodiment 1, wherein the plurality of metal structures are coupled together to form one-piece integral construction.

6. A photodetector device, comprising:
a photodetector array comprising an array of photodetectors and a plurality of metal structures arranged between photodetectors of the array of photodetectors, wherein the plurality of metal structures are arranged in a first pattern; and a transparent substrate comprising a plurality of trenches being patterned according to a second pattern that matches the first pattern and at least partially filled with an antireflective material such that the antireflective material takes on the second pattern, wherein the transparent substrate and the photodetector array are coupled together such that the first pattern is aligned with the second pattern and the antireflective material covers the plurality of metal structures.

7. The photodetector device of embodiment 6, wherein the plurality of trenches are partially filled with the antireflective material such that the antireflective material is embedded entirely within the transparent substrate.

8. The photodetector device of embodiment 7, further comprising:
at least one air gap formed between the antireflective material and each of the plurality of metal structures.

9. The photodetector device of embodiment 8, wherein the antireflective material is enclosed within the plurality of trenches and enclosed between the transparent plate and the plurality of metal structures.

10. The photodetector device of embodiment 6, wherein the plurality of trenches are coupled together to form a unitary trench.

11. The photodetector device of embodiment 6, wherein the plurality of trenches extend from a surface of the transparent substrate into the transparent substrate and the surface of the transparent substrate is coupled to the array of photodetectors.

12. The photodetector device of embodiment 6, wherein: the plurality of trenches extend from a surface of the transparent substrate into the transparent substrate, the plurality of trenches are completely filled with the antireflective material such that a surface of the antireflective material is planar with the surface of the transparent substrate, and the surface of the antireflective material is coupled to the plurality of metal structures.

13. The photodetector device of embodiment 12, wherein the surface of the antireflective material is in contact with the plurality of metal structures.

14. A method of manufacturing a photodetector device, the method comprising: providing a photodetector array comprising an array of photodetectors and a plurality of metal structures arranged between photodetectors of the array of photodetectors, wherein the plurality of metal structures are arranged in a first pattern; forming a plurality of trenches in a transparent substrate, the plurality of trenches being patterned according to a second pattern that matches the first pattern; at least partially filing the plurality of trenches with an antireflective material such that the antireflective material takes on the second pattern; aligning the transparent substrate over the photodetector array such that the first pattern is aligned with the second pattern; and coupling the transparent substrate to the photodetector array such that the antireflective material covers the plurality of metal structures.

15. The method of embodiment 14, wherein at least partially filing the plurality of trenches with the antireflective material comprises partially filling the plurality of trenches with the antireflective material such that the antireflective material is embedded entirely within the transparent substrate.

16. The method of embodiment 15, further comprising:
forming at least one air gap between the antireflective material and each of the plurality of metal structures by coupling the transparent substrate to the photodetector array.

17. The method of embodiment 16, wherein the antireflective material is enclosed within the plurality of trenches and enclosed between the transparent plate and the plurality of metal structures.

18. The method of embodiment 14, wherein forming the plurality of trenches in the transparent substrate comprises forming the plurality of trenches as a unitary trench.

19. The method of embodiment 14, wherein: forming the plurality of trenches in the transparent substrate comprises extending the plurality of trenches from a surface of the transparent substrate into the transparent substrate, and coupling the transparent substrate to the photodetector array comprises coupling the surface of the transparent substrate to the array of photodetectors.

20. The method of embodiment 14, wherein: forming the plurality of trenches in the transparent substrate comprises extending the plurality of trenches from a surface of the transparent substrate into the transparent substrate, at least partially filing the plurality of trenches with the antireflective material comprises completely filling the plurality of trenches with the antireflective material such that a surface of the antireflective material is planar with the surface of the transparent substrate, and coupling the transparent substrate to the photodetector array comprises coupling the surface of the antireflective material to the plurality of metal structures.

21. The method of embodiment 20, wherein the surface of the antireflective material is in contact with the plurality of metal structures.

22. A photodetector device, comprising: a photodetector array comprising an array of photodetectors and a plurality of metal structures arranged between photodetectors of the array of photodetectors, wherein the plurality of metal structures are arranged in a first pattern; and a transparent substrate comprising a plurality of diffusion structures being patterned according to a second pattern that matches the first pattern, wherein each of the plurality of diffusion structures is configured to redirect light that is incident thereon, wherein the transparent substrate and the photodetector array are coupled together such that the first pattern is aligned with the second pattern and the plurality of diffusion structures covers the plurality of metal structures.

23. The photodetector device of embodiment 22, wherein each of the plurality of diffusion structures is arranged adjacent to at least one of the plurality of metal structures and is configured to redirect the light that is incident thereon away from an adjacent metal structure and towards an adjacent photodetector.

24. The photodetector device of embodiment 22, wherein: each of the plurality of diffusion structures comprises a plurality of diffusion trenches that extend from a surface of the transparent substrate into the transparent substrate, and the surface of the transparent substrate is coupled to the array of photodetectors.

25. The photodetector device of embodiment 24, further comprising: an antireflective material, wherein the plurality of diffusion trenches of each of the plurality of diffusion structures are filled with the antireflective material such that a surface of the antireflective material is planar with the surface of the transparent substrate, and the surface of the antireflective material is coupled to the plurality of metal structures.

26. The photodetector device of embodiment 25, wherein the surface of the antireflective material is in contact with the plurality of metal structures.

27. The photodetector device of embodiment 22, further comprising: at least one air gap formed between the plurality of diffusion structures and each of the plurality of metal structures.

28. The photodetector device of embodiment 22, wherein: each of the plurality of diffusion structures comprises a plurality of diffusion trenches that extend from a surface of the transparent substrate into the transparent substrate, wherein the plurality of diffusion trenches form at least one air gap between the plurality of diffusion structures and each of the plurality of metal structures.

29. A method of manufacturing a photodetector device, the method comprising: providing a photodetector array comprising an array of photodetectors and a plurality of metal structures arranged between photodetectors of the array of photodetectors, wherein the plurality of metal structures are arranged in a first pattern; forming a plurality of diffusion structures in a transparent substrate, the plurality of diffusion structures being patterned according to a second pattern that matches the first pattern, wherein each of the plurality of diffusion structures is configured to redirect light that is incident thereon; aligning the transparent substrate over the photodetector array such that the first pattern is aligned with the second pattern; and coupling the transparent substrate to the photodetector array such that the plurality of diffusion structures covers the plurality of metal structures.

30. The method of embodiment 29, wherein coupling the transparent substrate to the photodetector array includes arranging each of the plurality of diffusion adjacent to at least one of the plurality of metal structures, wherein each of the plurality of diffusion structures is configured to redirect the light that is incident thereon away from an adjacent metal structure and towards an adjacent photodetector.

31. The photodetector device of embodiment 29, wherein: forming the plurality of diffusion structures in the transparent substrate comprises forming, for each of the plurality of diffusion structures, a plurality of diffusion trenches that extend from a surface of the transparent substrate into the transparent substrate, and coupling the transparent substrate to the photodetector array includes coupling the surface of the transparent substrate to the array of photodetectors.

32. The method of embodiment 31, further comprising: filling the plurality of diffusion trenches of each of the plurality of diffusion structures with an antireflective material such that a surface of the antireflective material is planar with the surface of the transparent substrate, and coupling the transparent substrate to the photodetector array includes coupling the surface of the antireflective material to the plurality of metal structures.

33. The method of embodiment 32, wherein the surface of the antireflective material is in contact with the plurality of metal structures.

34. The method of embodiment 31, wherein coupling the transparent substrate to the photodetector array includes forming at least one air gap between the plurality of diffusion structures and each of the plurality of metal structures.

35. The method of embodiment 29, wherein: forming the plurality of diffusion structures in the transparent substrate comprises forming, for each of the plurality of diffusion structures, a plurality of diffusion trenches that extend from a surface of the transparent substrate into the transparent substrate, and coupling the transparent substrate to the photodetector array includes forming at least one air gap by the plurality of diffusion trenches, the at least one air gap being formed between the plurality of diffusion structures and each of the plurality of metal structures.

Although some aspects have been described in the context of an apparatus, it is clear that these aspects also represent a description of the corresponding method of manufacturing, where the addition of each element corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer, or an electronic circuit. In some embodiments, some one or more of the method steps may be executed by such an apparatus.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Furthermore, the description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid in the understanding of the principles of the disclosure and the concepts contributed to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof. Thus, it is understood that modifications and variations of the arrangements and the details described herein will be apparent to others skilled in the art.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

What is claimed is:

1. A photodetector device, comprising:
a photodetector array comprising an array of photodetectors and a plurality of metal structures arranged laterally between photodetectors of the array of photodetectors, wherein the photodetectors are co-planar with the plurality of metal structures, and wherein the plurality of metal structures are arranged in a first pattern; and
a transparent substrate comprising a plurality of trenches being patterned according to a second pattern that matches the first pattern and at least partially filled with an antireflective material such that the antireflective material takes on the second pattern,
wherein the transparent substrate and the photodetector array are coupled together such that the first pattern is aligned with the second pattern and the antireflective material covers the plurality of metal structures.

2. The photodetector device of claim 1, wherein the plurality of trenches are partially filled with the antireflective material such that the antireflective material is embedded entirely within the transparent substrate.

3. The photodetector device of claim 1, wherein the plurality of trenches are coupled together to form a unitary trench.

4. The photodetector device of claim 1, wherein the plurality of trenches extend from a surface of the transparent substrate into the transparent substrate and the surface of the transparent substrate is coupled to the array of photodetectors.

5. The photodetector device of claim 1, wherein:
the plurality of trenches extend from a surface of the transparent substrate into the transparent substrate,
the plurality of trenches are completely filled with the antireflective material such that a surface of the antireflective material is planar with the surface of the transparent substrate, and
the surface of the antireflective material is coupled to the plurality of metal structures.

6. The photodetector device of claim 5, wherein the surface of the antireflective material is in contact with the plurality of metal structures.

7. The photodetector device of claim 1, wherein lateral sides of the plurality of metal structures are in contact with lateral sides of the photodetectors.

8. The photodetector device of claim 1, wherein each metal structure comprises at least one lateral side that is in direct contact with a lateral side of an adjacent photodetector of the array of photodetectors.

9. The photodetector device of claim 1, wherein the plurality of metal structures are connected together to form a unitary metal structure.

10. A photodetector device, comprising:
a photodetector array comprising an array of photodetectors and a plurality of metal structures arranged between photodetectors of the array of photodetectors, wherein the plurality of metal structures are arranged in a first pattern; and
a transparent substrate comprising a plurality of trenches being patterned according to a second pattern that matches the first pattern and at least partially filled with an antireflective material such that the antireflective material takes on the second pattern,
wherein the transparent substrate and the photodetector array are coupled together such that the first pattern is aligned with the second pattern and the antireflective material covers the plurality of metal structures,
the photodetector device further comprising:
at least one air gap formed between the antireflective material and each of the plurality of metal structures.

11. The photodetector device of claim 10, wherein the antireflective material is enclosed within the plurality of trenches and enclosed between the transparent plate and the plurality of metal structures.

12. A method of manufacturing a photodetector device, the method comprising:
providing a photodetector array comprising an array of photodetectors and a plurality of metal structures arranged between photodetectors of the array of photodetectors, wherein the plurality of metal structures are arranged in a first pattern;
forming a plurality of trenches in a transparent substrate, the plurality of trenches being patterned according to a second pattern that matches the first pattern;
at least partially filing the plurality of trenches with an antireflective material such that the antireflective material takes on the second pattern;
aligning the transparent substrate over the photodetector array such that the first pattern is aligned with the second pattern; and
coupling the transparent substrate to the photodetector array such that the antireflective material covers the plurality of metal structures.

13. The method of claim 12, wherein at least partially filing the plurality of trenches with the antireflective material comprises partially filling the plurality of trenches with the antireflective material such that the antireflective material is embedded entirely within the transparent substrate.

14. The method of claim 13, further comprising:
forming at least one air gap between the antireflective material and each of the plurality of metal structures by coupling the transparent substrate to the photodetector array.

15. The method of claim 14, wherein the antireflective material is enclosed within the plurality of trenches and enclosed between the transparent plate and the plurality of metal structures.

16. The method of claim 12, wherein forming the plurality of trenches in the transparent substrate comprises forming the plurality of trenches as a unitary trench.

17. The method of claim 12, wherein:
forming the plurality of trenches in the transparent substrate comprises extending the plurality of trenches from a surface of the transparent substrate into the transparent substrate, and
coupling the transparent substrate to the photodetector array comprises coupling the surface of the transparent substrate to the array of photodetectors.

18. The method of claim 12, wherein:
forming the plurality of trenches in the transparent substrate comprises extending the plurality of trenches from a surface of the transparent substrate into the transparent substrate,
at least partially filing the plurality of trenches with the antireflective material comprises completely filling the plurality of trenches with the antireflective material such that a surface of the antireflective material is planar with the surface of the transparent substrate, and coupling the transparent substrate to the photodetector array comprises coupling the surface of the antireflective material to the plurality of metal structures.

19. The method of claim 18, wherein the surface of the antireflective material is in contact with the plurality of metal structures.

\* \* \* \* \*